United States Patent [19]

Thalapaneni

[11] Patent Number: 5,572,067
[45] Date of Patent: Nov. 5, 1996

[54] SACRIFICIAL CORNER STRUCTURES

[75] Inventor: Guru Thalapaneni, Union City, Calif.

[73] Assignee: Altera Corporation, San Jose, Calif.

[21] Appl. No.: 318,920

[22] Filed: Oct. 6, 1994

[51] Int. Cl.⁶ .......................... H01L 23/13; H01L 23/18
[52] U.S. Cl. ................. 257/669; 257/747; 257/420
[58] Field of Search ........................... 257/618, 420, 257/620, 750, 753, 773, 207, 211, 747, 748, 669

[56] References Cited

U.S. PATENT DOCUMENTS

| | | | |
|---|---|---|---|
| 4,625,227 | 11/1986 | Hara et al. | 257/669 |
| 4,928,162 | 5/1990 | Lesk et al. | 257/338 |
| 4,952,999 | 8/1990 | Robinson et al. | 257/669 |
| 5,023,699 | 6/1991 | Hara et al. | 257/669 |
| 5,134,463 | 7/1992 | Yamaguchi | 257/772 |
| 5,187,558 | 2/1993 | Nakashima et al. | 257/538 |
| 5,266,832 | 11/1993 | Yamamoto et al. | 257/787 |
| 5,329,162 | 7/1994 | Nadaoka | 257/774 |

FOREIGN PATENT DOCUMENTS

| | | |
|---|---|---|
| 0407933A2 | 1/1991 | European Pat. Off. . |
| 59-163841 | 9/1984 | Japan . |
| 62-193263 | 8/1987 | Japan . |
| 3-136332 | 6/1991 | Japan . |
| 4-342137 | 11/1992 | Japan . |
| 6-069211 | 3/1994 | Japan . |

OTHER PUBLICATIONS

P. Nixon et al., "Shear Stress Damage to Chips: A Design Solution," *TI Technical Journal*, Jun. 1988, pp. 96–105.

R. E. Thomas, "Stress–Induces Deformation of Aluminum Metallization in Plastic Molded Semiconductor Devices," Materials Technology Laboratory, SRDL, Technical Report No. MTL–85–45 (Motorola) Mar. 11, 1985, pp. 1–26.

R. Foehringer et al., "Thin Film Cracking in Plastic Packages Analysis, Model and Improvements," Intel Corporation, 0569–5503/91/0000–0759–0764, 1991, *IEEE*.

Primary Examiner—Robert P. Limanek
Assistant Examiner—David B. Haroy
Attorney, Agent, or Firm—Townsend and Townsend and Crew, LLP

[57] ABSTRACT

An integrated circuit chip die (12) is manufactured with sacrificial structures (16) placed at the areas of die that are likely to experience cracks. According to one embodiment of the invention, these sacrificial structures are placed at the corners of the die. The sacrificial structures are constructed with metal lines (22, 24) that resist propagation of cracks into the area of the die containing electronic devices. The metal lines form lattice steps so that the surface of the die will more tightly bond to the molding compound that makes up the die package.

7 Claims, 3 Drawing Sheets

SACRIFICIAL CORNER STRUCTURES

BACKGROUND OF THE INVENTION

This invention relates to the fabrication of devices on thin, rigid materials. More particularly, this invention relates to the manufacture of integrated circuits on wafers of silicon or other semiconductor material.

The explosion in the electronics industry over the last several decades has largely been fueled by manufacturing techniques allowing for the construction of millions of microscopic electronic circuit elements onto integrated circuits made up of layers of silicon, other metals, semiconductor materials, and insulation materials. Typically, microelectronic circuits are fabricated on thin wafers of silicon measuring approximately five to eight inches in diameter and having a thickness of approximately 20 mils. Integrated circuits may be manufactured by a variety of processes including photolithography, epitaxial deposition, ion implantation, etc. These processes create layers of different materials on top of the silicon wafer substrate and in these layers are formed various circuit elements. Typically, a number of identical integrated circuits are fabricated at the same time on a single silicon wafer and then the wafer is cut or scored into a number of dies, each die containing one device. FIG. 1 depicts a silicon wafer 10 of the prior art showing scoring lines 11 dividing the wafer into a number of dies 12. A die such as 12a typically contains one integrated circuit. After fabrication and scoring, the die is typically packaged in a housing made of a plastic or ceramic molding compound. The die package contains leads allowing the packaged die (also referred to as a "chip") to be interconnected with other chips in an electronic apparatus such as a computer. The die is connected to the leads by a number of wire bonds, each wire bond connecting a pad on the die to a lead.

While a die such as 12a is primarily an electrical apparatus, its physical characteristics may be very important in its overall reliability. One problem that has commonly arisen in the manufacture of integrated circuit dies is the problem of cracking of the metal, semiconductor, and passivation layers. The cracking phenomenon is often observed during temperature cycling used to test manufactured packaged integrated circuits. The cracking affects electrical reliability of the integrated circuits by causing shorts or current leakage failures. Failure analysis has shown that the metal layers are cracked especially in the die corners. It is believed that cracking occurs as a result of the direct interaction of the die surface with the molding compound that makes up the packaging, the driving force being the stresses arising from the large mismatch in coefficients of thermal expansion among the adjacent materials.

One method that has been used to reduce or prevent die cracking is use of a gel die coating. This gel may be a compound such as silicone-vinyl or silicone-hydride. The gel is placed on the die and adhesed prior to the die being encased in the chip packaging. The gel absorbs stresses that arise due to the different thermal expansion of the die material and the material that makes up the chip packaging.

While use of die coat has been found to greatly reduce cracking, the die coat creates other problems. Chief among those is that interaction between the coat, the pads and the wire bonds may break some of the wire bonds, again reducing chip reliability. Use of die coat also adds additional process steps to the chip manufacture, which increases the total chip cost.

What is needed is an improved die structure and a method for preventing cracks that form in the metal and passivation layers on an integrated circuit die.

SUMMARY OF THE INVENTION

According to the invention, a die for use in an integrated circuit chip is manufactured with sacrificial structures placed at the areas of die that are likely to experience cracks. According to one embodiment of the invention, these sacrificial structures are placed at the corners of the die. According to a further embodiment of the invention, areas of the die including the sacrificial structures are constructed in such a way to form lattice steps so that the surface of the die will more tightly bond to the molding compound that makes up the die package. According to a further embodiment of the invention, the sacrificial structures include transverse elements to prevent the propagation of cracks that do form from reaching the areas of the die containing electrical circuit elements.

The invention may be better understood upon reference to the following detailed description and the accompanying drawings.

DETAILED DESCRIPTION OF SPECIFIC EMBODIMENTS

Figure 2:
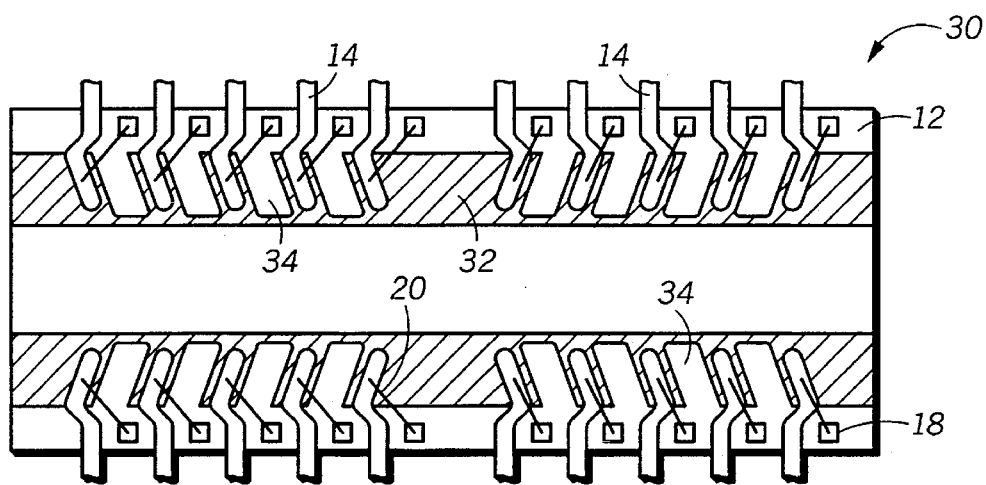
FIG. 2 is an illustration of a die containing sacrificial corner structures.

FIG. 2 shows a die 12 containing sacrificial corner structures 16a–d and operational region 15 according to one embodiment of the invention. Operational region 15 may be microfabricated to contain a plurality of electronic and other devices as is known in the art. As can be seen in the Figure, the sacrificial structures are placed in the area of the die most prone to crack formation, i.e., the die corners.

Figure 3:
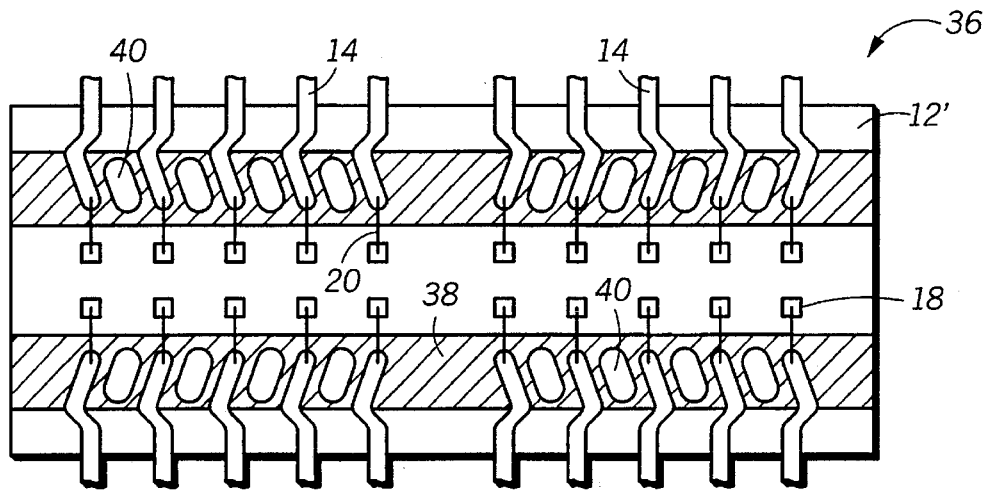
FIG. 3 is an illustration of one sacrificial corner structure according to a specific embodiment of the invention.
Figure 3:
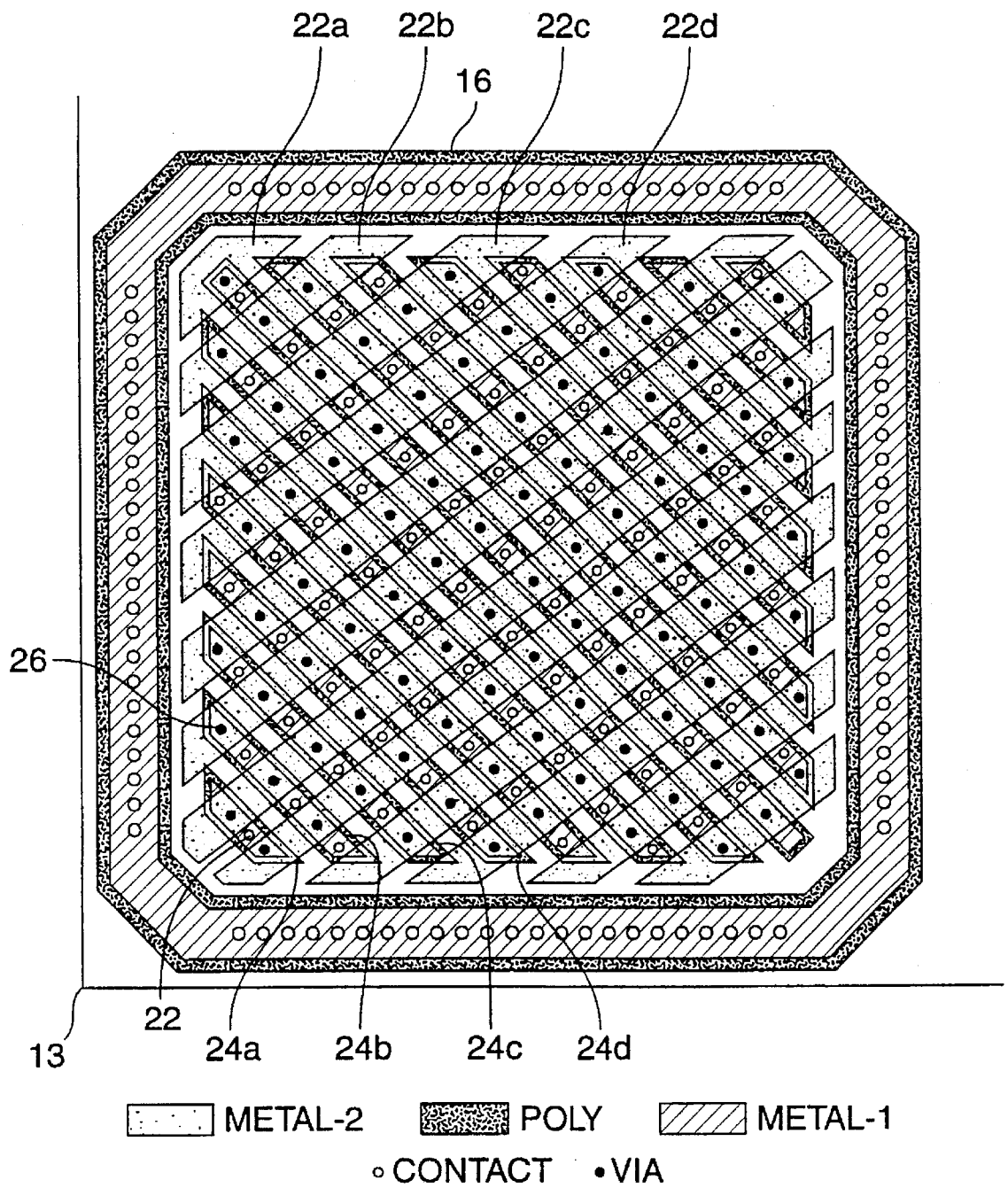

FIG. 3 illustrates one of the sacrificial corner structures 16 according to one embodiment of the invention. Sacrificial corner structure 16 is fabricated with a number of lower layer metal elements 22. These metal elements 22 run in a direction parallel to a line running from the corner of the die to the center of the die. Metal lines 22 provide a support lattice for upper layer metal lines 24 that are designed to resist crack propagation. Upper layer metal lines 24 run in a direction perpendicular to a line from the corner of the die to the center of the die. These upper layer metal lines are designed to absorb cracks which form at or near the chip corner before the cracks can propagate to the center area of the die containing circuit elements. Upper layer metal lines 24 and lower layer metal lines 22 are connected by vias 26 which provide a metal-to-metal contact to increase the strength of the lattice. Upper layer metal lines 24 are in addition connected to poly by vias 28.

Figure 4:
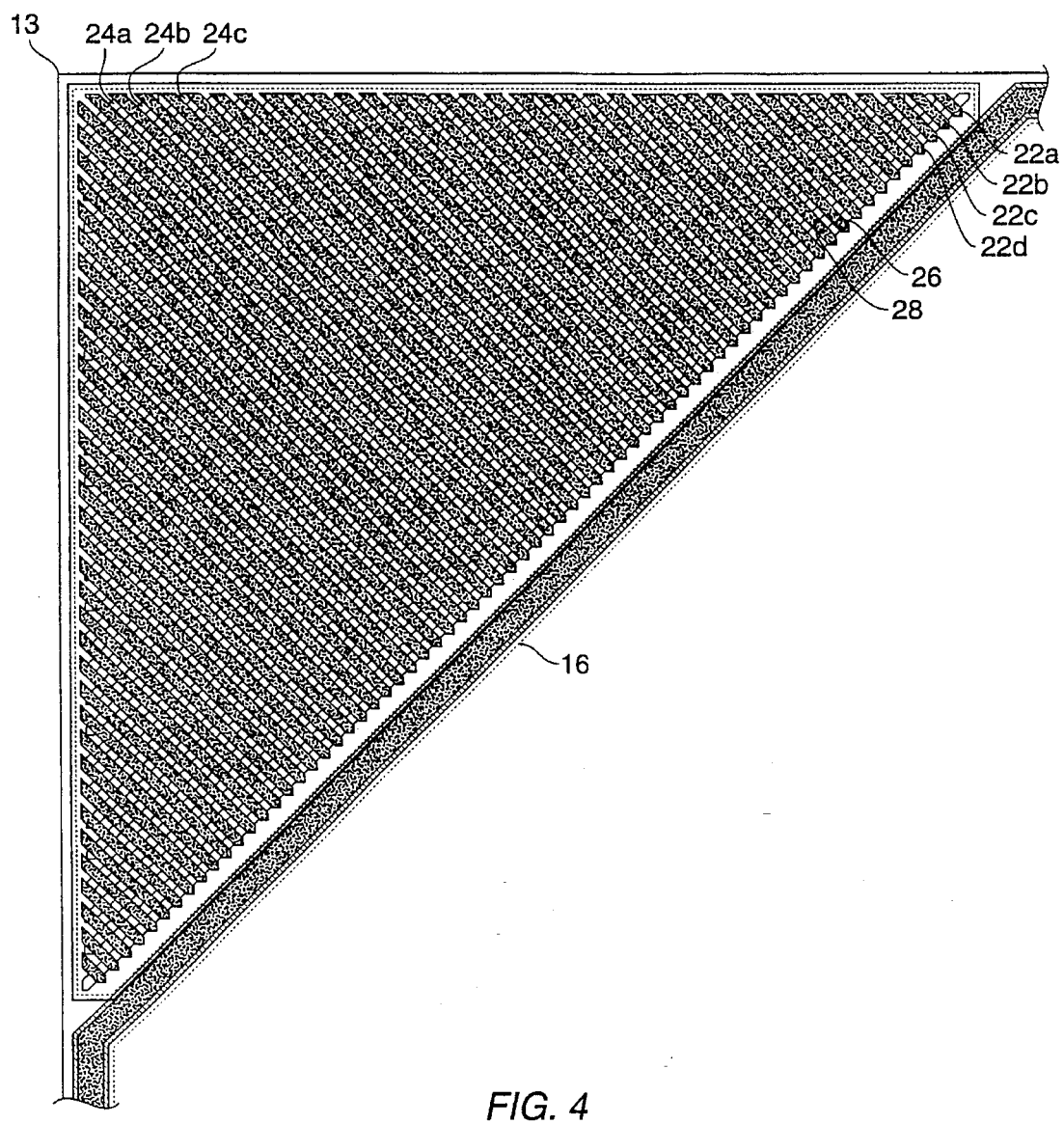
FIG. 4 is an illustration of a sacrificial corner structure according to an alternative embodiment of the invention.

FIG. 4 is an illustration of a sacrificial corner structure according to an alternative embodiment of the invention. It contains lower layer metal lines 22 upper layer lines 24 connected by vias 26 and contacts 28 in a configuration forming a triangle.

Sacrificial corner structure 16 resists cracks that form at the corner as follows. A crack forming at or near die corner 13 due to higher shear stress will propagate through the silicon until it reaches corner structure 16 where it will initially encounter an upper layer metal line 24. Metal line 24 will tend to resist the crack and absorb the sheer stress thereby preventing the crack from propagating into the surface area of the chip.

Figure 5:
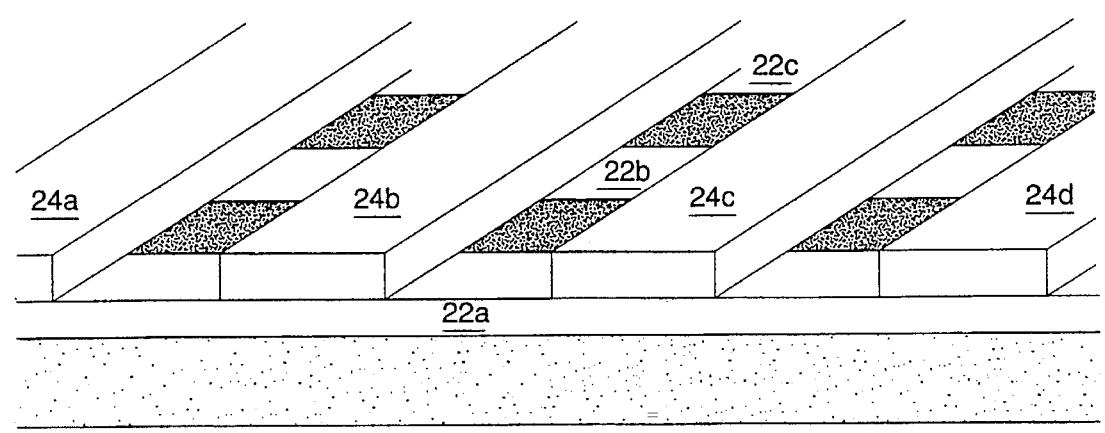
FIG. 5 is a cross-sectional illustration of a sacrificial corner structure having vertical lattice steps according to one embodiment of the invention.
Figure 1:
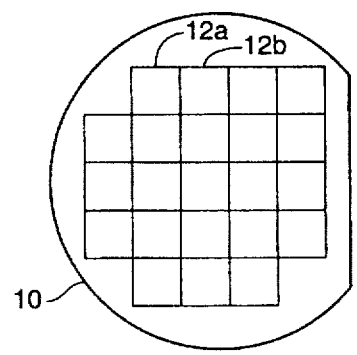
Figure 2:
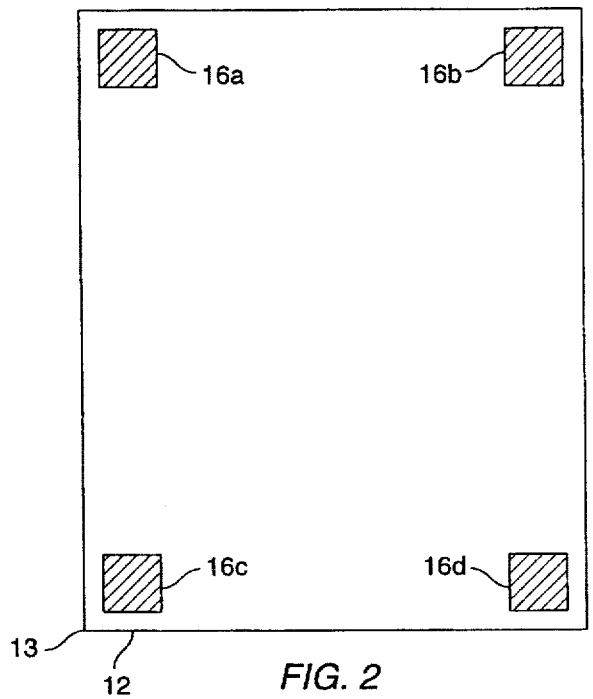

FIG. 5 is a cross-sectional view of a section of a sacrificial corner structure according to an embodiment of the invention. As can be seen in the figure the corner structure provides a vertical lattice. When the die is mounted in a plastic housing the vertical lattice of the corner structure will allow the viscous plastic material to move into the spaces between the metal lines thereby forming a tighter bond.

The invention has now been described with reference to specific embodiments. Alternative embodiments and variations will be obvious from the above specification and drawings to one of ordinary skill in the art. It is therefore not intended that the invention be limited except as provided in the following claims.

What is claimed is:

1. An apparatus for resisting propagation and formation of cracks in a fabricated integrated circuit wherein said integrated circuit is formed on a polygonal die having a plurality of layers of one or more materials, said die having a shape that is nearly polygonal with a vertical dimension substantially smaller than its horizontal dimensions, said layers comprising horizontal layers and further comprising at least an upper layer and a lower layer, said layers being vertically stacked to form said die, said die having a lower surface comprising a substrate and an upper surface, said apparatus located in a region near the corner of said polygonal die on at least one surface comprising:

a plurality of lower layer metal lines running nearly parallel to a direction from said corner of said polygonal die to near the center of said polygonal die;

a plurality of upper layer metal lines running at a transverse angle to said plurality of lower layer metal lines; and a plurality of vias connecting said plurality of upper layer metal lines to said plurality of lower layer metal lines.

2. The apparatus according to claim 1 wherein said plurality of upper layer metal lines and said plurality of lower layer metal lines form a vertical step lattice in a region near the corner area on a surface of said die, said vertical step lattice being capable of bonding more tightly to a packaging material than are other areas of said die.

3. A sacrificial corner structure for preventing the propagation of cracks and for relieving stress due to thermal expansion in an integrated circuit wherein said integrated circuit is formed on a die having a shape that is nearly polygonal, said structure located in a region near a corner of said polygonal die comprising:

a plurality of first metal lines running nearly parallel to a direction from said corner of said die to near a center of said polygonal die; and a plurality of transverse metal lines running transverse to said plurality of first metal lines.

4. The sacrificial corner structure according to claim 3 further comprising a plurality of vias connecting said plurality of first metal lines and said plurality of transverse metal lines.

5. A method for preventing formation and propagation of stress cracks on an integrated circuit die due to thermal expansion comprising:

in areas of said die particularly susceptible to formation of stress cracks, fabricating metal lines parallel to an expected direction of propagation of said cracks; and in said areas particularly susceptible to formation of said stress cracks, fabricating metal lines transverse to said expected direction of propagation of said cracks.

6. The method according to claim 5 further comprising interconnecting said parallel and said transverse metal lines with a plurality of vias.

7. A method for reducing effects of stress on an integrated circuit die due to different thermal expansion coefficients between said die and a packaging material, said method comprising:

fabricating said die with a plurality of vertical step lattice regions said lattice regions formed on a surface of said die and defining vertical steps descending from said surface towards a substrate of said die; and placing said die in said packaging material, said packaging material being viscous at the time said die is placed in said packaging material and subsequently hardening, said packaging material adhering to said lattice regions upon hardening.

* * * * *

UNITED STATES PATENT AND TRADEMARK OFFICE
CERTIFICATE OF CORRECTION

PATENT NO. : 5,572,067
DATED : November 5, 1996
INVENTOR(S) : Guru Thalapaneni

Figure 1:
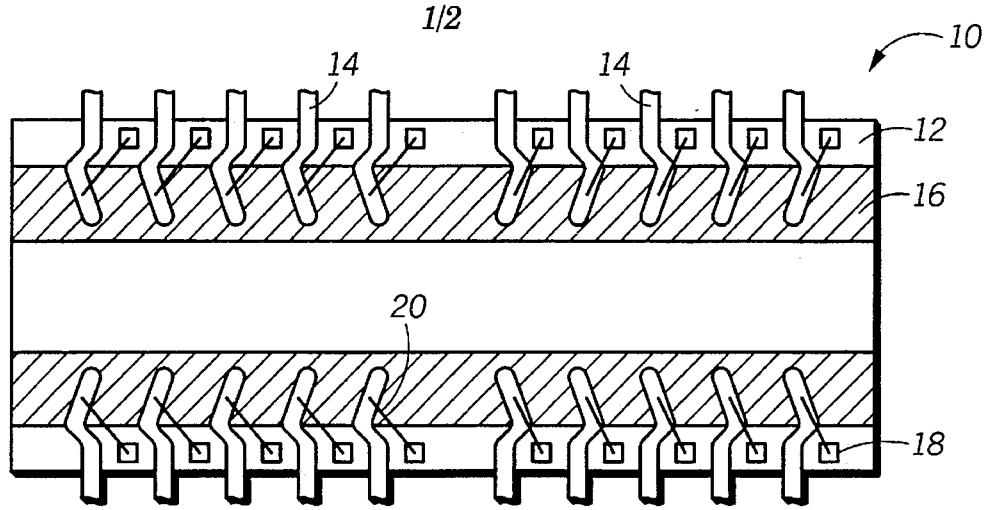
FIG. 1 is an illustration of a prior art silicon wafer scored to create a number of dies.

It is certified that error appears in the above-identified patent and that said Letters Patent is hereby corrected as shown below:

Drawings:

Delete sheet 1 of 3 and substitute therefor the following attached sheet consisting of Figs. 1 and 2.

Signed and Sealed this

Twenty-second Day of July, 1997

Attest:

BRUCE LEHMAN

*Attesting Officer*  *Commissioner of Patents and Trademarks*